(12) United States Patent  (10) Patent No.: US 8,958,217 B2
Ramabhadran et al.  (45) Date of Patent: Feb. 17, 2015

(54) SYSTEM FOR DRIVING A PIEZOELECTRIC LOAD AND METHOD OF MAKING SAME

(75) Inventors: Ramanujam Ramabhadran, Niskayuna, NY (US); John Stanley Glaser, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 291 days.

(21) Appl. No.: 13/524,901

(22) Filed: Jun. 15, 2012

(65) Prior Publication Data

US 2013/0336035 A1 Dec. 19, 2013

(51) Int. Cl.
  *H02M 3/335* (2006.01)
(52) U.S. Cl.
  USPC ..................... 363/21.12; 363/21.18
(58) Field of Classification Search
  USPC .................. 363/21.08, 21.12, 21.18; 310/317
  See application file for complete search history.

(56) References Cited

U.S. PATENT DOCUMENTS

| | | | |
|---|---|---|---|
| 5,376,854 A * | 12/1994 | Oouchi | 310/316.01 |
| 5,479,062 A * | 12/1995 | Yoshino | 310/317 |
| 5,563,464 A | 10/1996 | Okubu et al. | |
| 6,084,784 A * | 7/2000 | Durbaum | 363/21.12 |
| 6,594,161 B2 * | 7/2003 | Jansen et al. | 363/21.14 |
| 7,915,944 B2 | 3/2011 | Caiafa et al. | |
| 7,924,580 B2 | 4/2011 | Glaser et al. | |
| 7,929,325 B2 | 4/2011 | de Rooij et al. | |
| 8,023,296 B2 | 9/2011 | Tao et al. | |
| 8,023,297 B2 | 9/2011 | de Rooij et al. | |
| 2003/0090914 A1* | 5/2003 | Jansen et al. | 363/21.12 |
| 2003/0111933 A1 | 6/2003 | Gallmeyer | |
| 2003/0164658 A1 | 9/2003 | Saraf | |
| 2008/0112193 A1* | 5/2008 | Yan et al. | 363/21.08 |
| 2008/0304292 A1* | 12/2008 | Zeng et al. | 363/21.12 |

\* cited by examiner

*Primary Examiner* — Jue Zhang
(74) *Attorney, Agent, or Firm* — Ziolkowski Patent Solutions Group, SC; Jean K. Testa

(57) ABSTRACT

A system for driving a piezoelectric load includes a direct current (DC) voltage source and a bi-directional DC-to-DC converter having a primary side coupled to the DC voltage source and a secondary side and comprising a control input configured to receive a first control signal configured to control conversion of a first voltage on the primary side of the bi-directional DC-to-DC converter to a second voltage on the secondary side of the bi-directional DC-to-DC converter. The driver system also includes a capacitor coupled to the secondary side of the bi-directional DC-to-DC converter and configured to remove a DC offset of the second voltage and includes a reactive load having a first terminal coupled to the capacitor and a second terminal coupled to the secondary side of the bi-directional DC-to-DC converter.

23 Claims, 5 Drawing Sheets

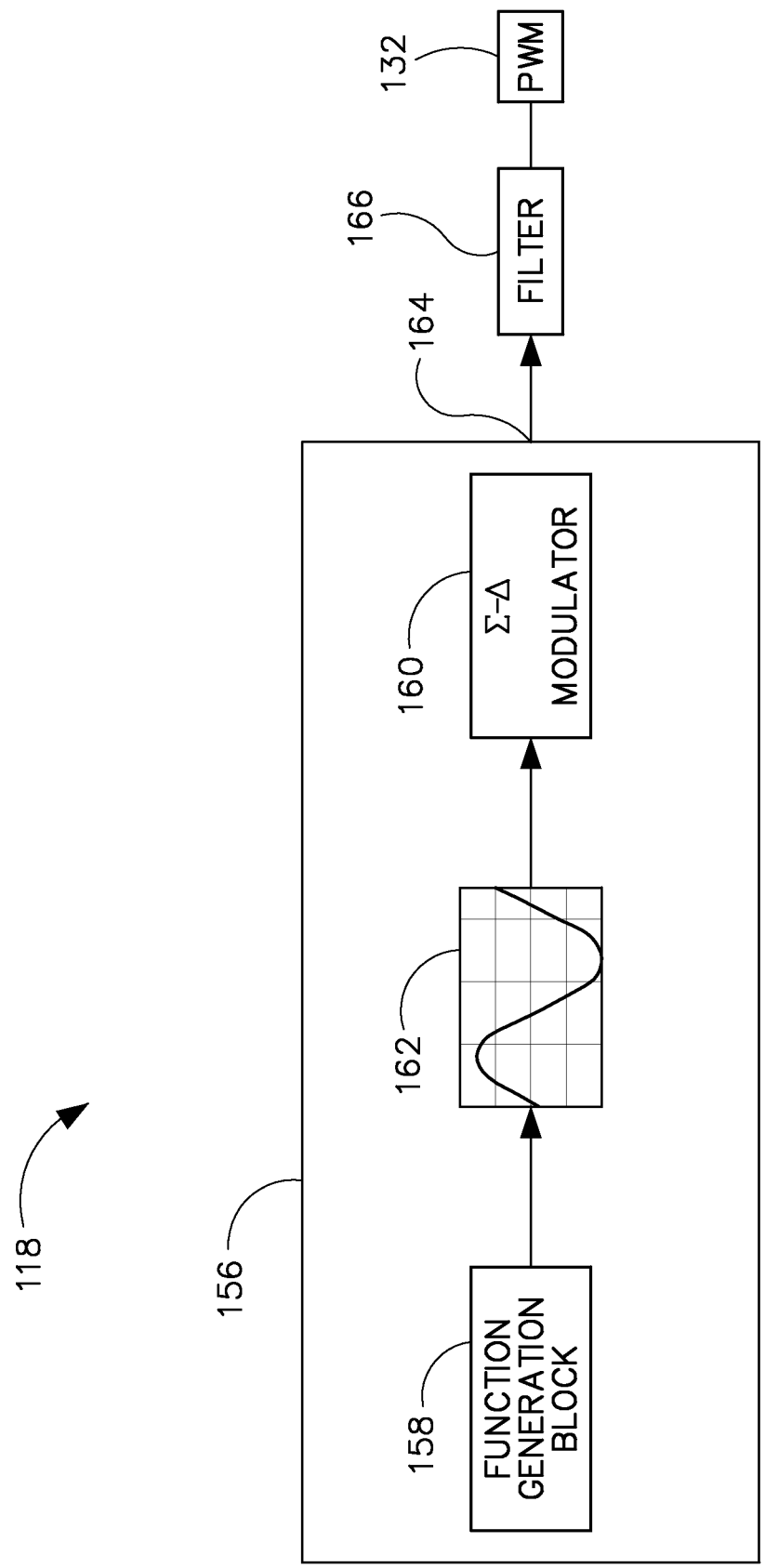

SYSTEM FOR DRIVING A PIEZOELECTRIC LOAD AND METHOD OF MAKING SAME

BACKGROUND OF THE INVENTION

Embodiments of the invention relate generally to piezoelectric actuators and, more particularly, to a driver circuit for piezoelectric actuators.

Piezoelectric materials are known to change dimensions upon application of an electric field. This phenomenon allows the use of piezoelectric materials to be used as actuators in micro-electro-mechanical system (MEMS) devices. For example, such actuators have been used in synthetic jet actuators that generate a synthetic jet of fluid to influence the flow of that fluid over a surface. A typical synthetic jet actuator comprises a housing defining an internal chamber. An orifice is present in a wall of the housing. The actuator further includes a mechanism in or about the housing for periodically changing the volume within the internal chamber so that a series of fluid vortices are generated and projected in an external environment out from the orifice of the housing. Examples of volume changing mechanisms may include, for example, a piston positioned in the jet housing to move fluid in and out of the orifice during reciprocation of the piston or a flexible diaphragm as a wall of the housing. The flexible diaphragm is typically actuated by a piezoelectric actuator or other appropriate means.

Typically, piezoelectric actuators often require voltages in the tens of volts or higher for proper operation, and some classes of actuators require AC voltages of possibly variable frequency and amplitude. In applications where piezoelectric actuators are interfaced with low voltage circuitry such as in portable, consumer, aviation, or transportation electronic devices, it can be difficult to drive these actuators. For example, when trying to drive a piezoelectric actuator with an AC voltage waveform or one with variable value with peak voltages higher than are available from a power source, known methods often accomplish this goal using complex, inefficient, large, and/or expensive drivers. In addition, many applications where piezoelectric actuators are used call for using minimum power consumption, and inefficient piezoelectric actuator drivers having low efficiencies often fail such minimum power consumption requirements.

Accordingly, there is a need for a system for driving a piezoelectric load so as to provide a highly efficient driver circuit that can operate from a low voltage source and efficiently generate a controllable high voltage AC waveform of variable frequency and amplitude.

BRIEF DESCRIPTION OF THE INVENTION

According to an aspect of the invention, a driver system includes a direct current (DC) voltage source and a bi-directional DC-to-DC converter having a primary side coupled to the DC voltage source and a secondary side and comprising a control input configured to receive a first control signal configured to control conversion of a first voltage on the primary side of the bi-directional DC-to-DC converter to a second voltage on the secondary side of the bi-directional DC-to-DC converter. The driver system also includes a capacitor coupled to the secondary side of the bi-directional DC-to-DC converter and configured to remove a DC offset of the second voltage and includes a reactive load having a first terminal coupled to the capacitor and a second terminal coupled to the secondary side of the bi-directional DC-to-DC converter.

According to another aspect of the invention, a method of manufacturing a piezoelectric driver includes coupling a direct current (DC) voltage source to a low-voltage side of a voltage converter, wherein the voltage converter comprises a bi-directional DC-to-DC voltage converter, coupling a first high-voltage side terminal on a high-voltage side of the voltage converter to a blocking capacitor, and coupling the blocking capacitor to a first side of a piezoelectric actuator. The method also includes coupling a second side of the piezoelectric actuator to a second high-voltage side terminal of the voltage converter, coupling a control system to the voltage converter, and configuring the control system to supply a first control signal to the voltage converter. The first control signal controls the voltage converter to convert a voltage on the low-voltage side of the voltage converter to the high-voltage side of the voltage converter.

According to yet another aspect of the invention, a piezoelectric driver includes a first bi-directional DC-to-DC voltage converter having a low-voltage side and a high-voltage side, a direct current (DC) voltage source coupled to the pair of low-side terminals, and a DC blocking capacitor coupled to the first high-voltage side terminal and comprising. The first bi-directional DC-to-DC voltage converter includes a pair of low-side terminals, a first high-voltage side terminal, and a second high-voltage side terminal. The piezoelectric driver also includes a piezoelectric actuator coupled to the DC blocking capacitor and coupled to the second high-voltage side terminal and includes a control system coupled to the first voltage converter and configured to supply a first control signal to the first bi-directional DC-to-DC voltage converter, wherein the first control signal is configured to control the first bi-directional DC-to-DC voltage converter to convert a voltage on the low-voltage side of the first bi-directional DC-to-DC voltage converter to the high-voltage side of the first bi-directional DC-to-DC voltage converter.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIG. 5 is a block schematic diagram illustrating a reference signal generator according to an embodiment of the invention.

DETAILED DESCRIPTION

Figure 1:
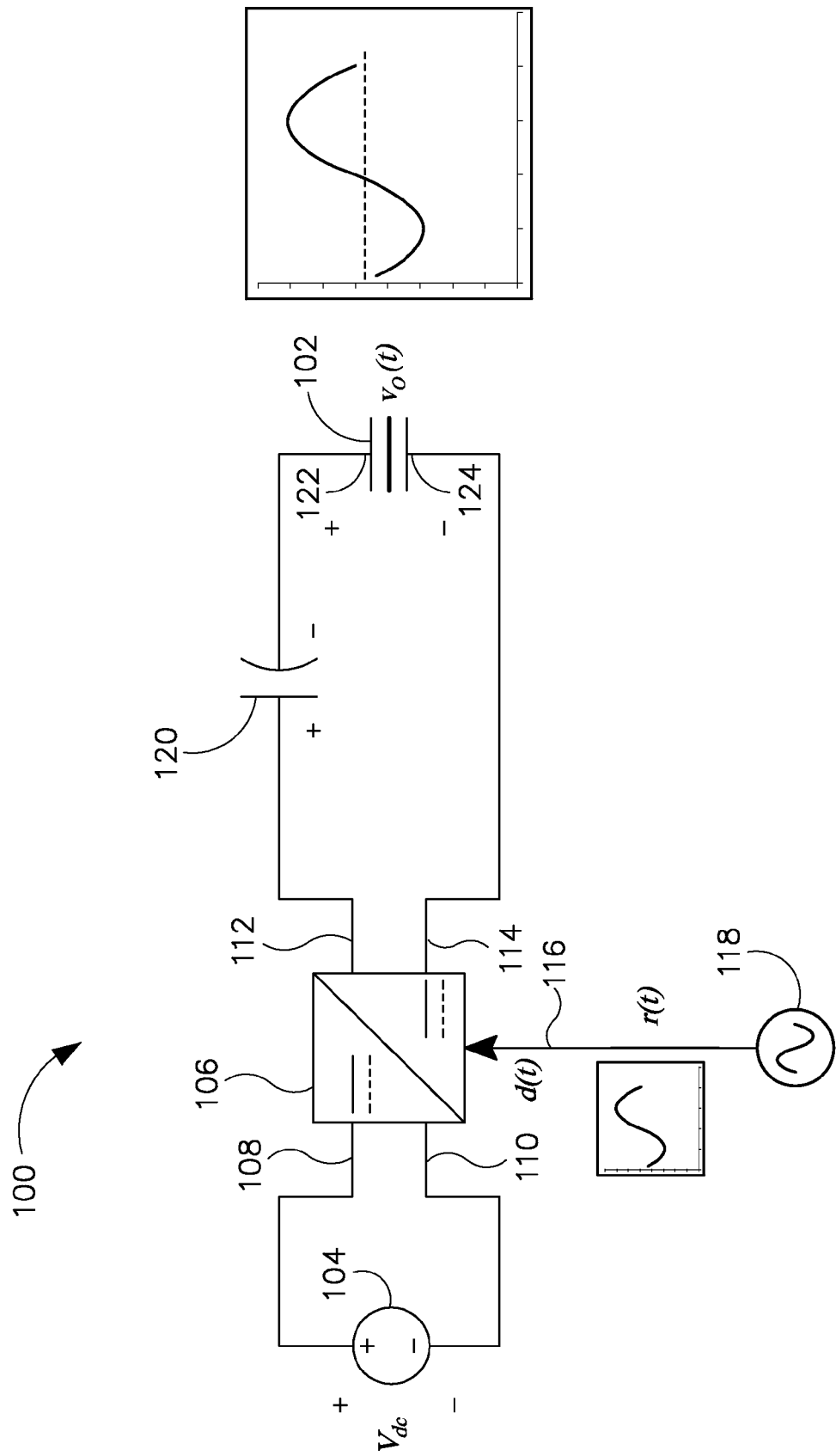
FIG. 1 is a block schematic diagram illustrating a piezoelectric driver for a piezoelectric load according to an embodiment of the invention.

Referring to FIG. 1, a block schematic diagram illustrates a piezoelectric driver 100 coupled to a piezoelectric load or actuator 102. Piezoelectric load 102 is a capacitive or reactive load.

Piezoelectric driver 100 includes a single voltage source 104 and a single converter 106. Converter 106 is a bi-directional switch-mode power converter/amplifier configured to take a voltage from voltage source 104 supplied to a pair of converter terminals 108, 110 and to boost the supplied voltage to another pair of converter terminals 112, 114. Converter 106 also bucks voltages from terminals 112, 114 to terminals 108, 110.

Converter 106 bucks or boosts voltage based on a control input 116. A reference signal, d(t), of which an amplified version is intended to drive piezoelectric load 102, is supplied to control input 116 from a reference signal source 118. Converter terminal 112 is coupled to a DC blocking capacitor 120, which is coupled to a first terminal 122 of piezoelectric load 102. Converter terminal 114 is coupled to a second terminal 124 of piezoelectric load 102.

The sinusoidal reference signal, d(t), controls converter 106 to generate an amplified sinusoidal waveform with a DC offset. The DC blocking capacitor 120 at the output of converter 106 removes the DC offset and produces a pure AC or sinusoidal signal waveform to drive the piezoelectric load 102.

As illustrated in FIG. 1, output voltage $v_O(t)$ of converter 106 is supplied to piezoelectric load 102. Often, it is desired that $v_O(t)=k*r(t)$, where k equals a constant gain. In this manner, the output voltage, $v_O(t)$, equals a constant gain times the reference signal.

At many frequencies, the impedance of a piezoelectric load such as actuator 102 has a substantial reactive component. As such, under an AC drive condition, power will flow in and out of the load each AC cycle. Accordingly, converter 106 is a bi-directional converter, as stated above, so as to accommodate this bi-directional power flow.

Figure 2:
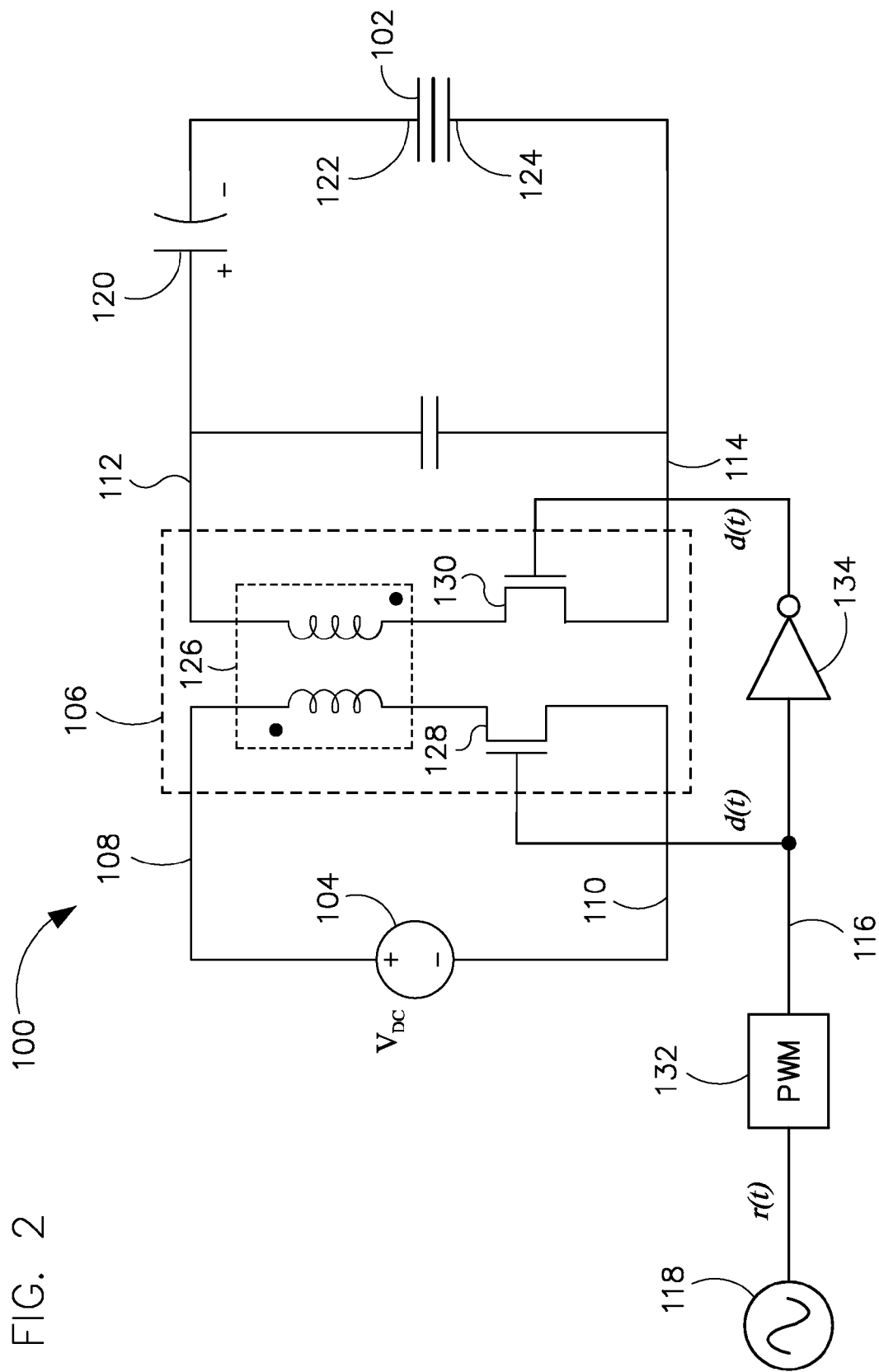
FIG. 2 is a schematic diagram illustrating a piezoelectric driver circuit for a piezoelectric load according to an embodiment of the invention.

While converter 106 may be any kind of bi-directional converter capable of boosting and bucking voltage, FIG. 2 illustrates a bi-directional fly-back buck/boost converter embodiment according to an embodiment of the invention. Such fly-back converters are suitable for when large voltage boosts are needed and/or when isolation is needed. Embodiments of the invention also contemplate, however, that variations on converters, such as soft-switching or active clamping to reduce switching losses, can also be used with the circuits described herein.

As shown, converter 106 includes a transformer 126 and a pair of switches 128, 130. Switches 128-130 are power switches and may be, for example, MOSFETs, IGBTs, SCRs, and other power switches known in the art. In one embodiment, a pulse-width modulator (PWM) 132 is controlled to digitize an AC or sinusoidal reference signal r(t) to control the conversion process in converter 106. Control input 116 of PWM 132 is tied to switch 128 and is configured to deliver a control signal $d_1(t)$ thereto. A converse ($\overline{d(t)}$) of the control signal $d_1(t)$ is generated by a signal complement generator 134 that is tied to switch 130. In one exemplary case, $d_1(t)=k1*r(t)$, and $\overline{d(t)}=1-k1*r(t)$, where the $d_x(t)$ are switch duty cycles, k1 is a constant, and r(t) is a reference signal.

In this embodiment, the voltage applied to blocking capacitor 120 is an amplified version of the reference signal r(t). This voltage is shaped as the desired waveform and has a DC offset allowing the fly-back converter to operate in the boost mode. Blocking capacitor 120 then removes the DC offset to allow piezoelectric driver 100 to drive piezoelectric load 102 with an AC wave. In this manner, piezoelectric driver 100 is configured to generate a high voltage AC waveform for driving piezoelectric load 102 from a relatively low voltage source 104.

Figure 3:
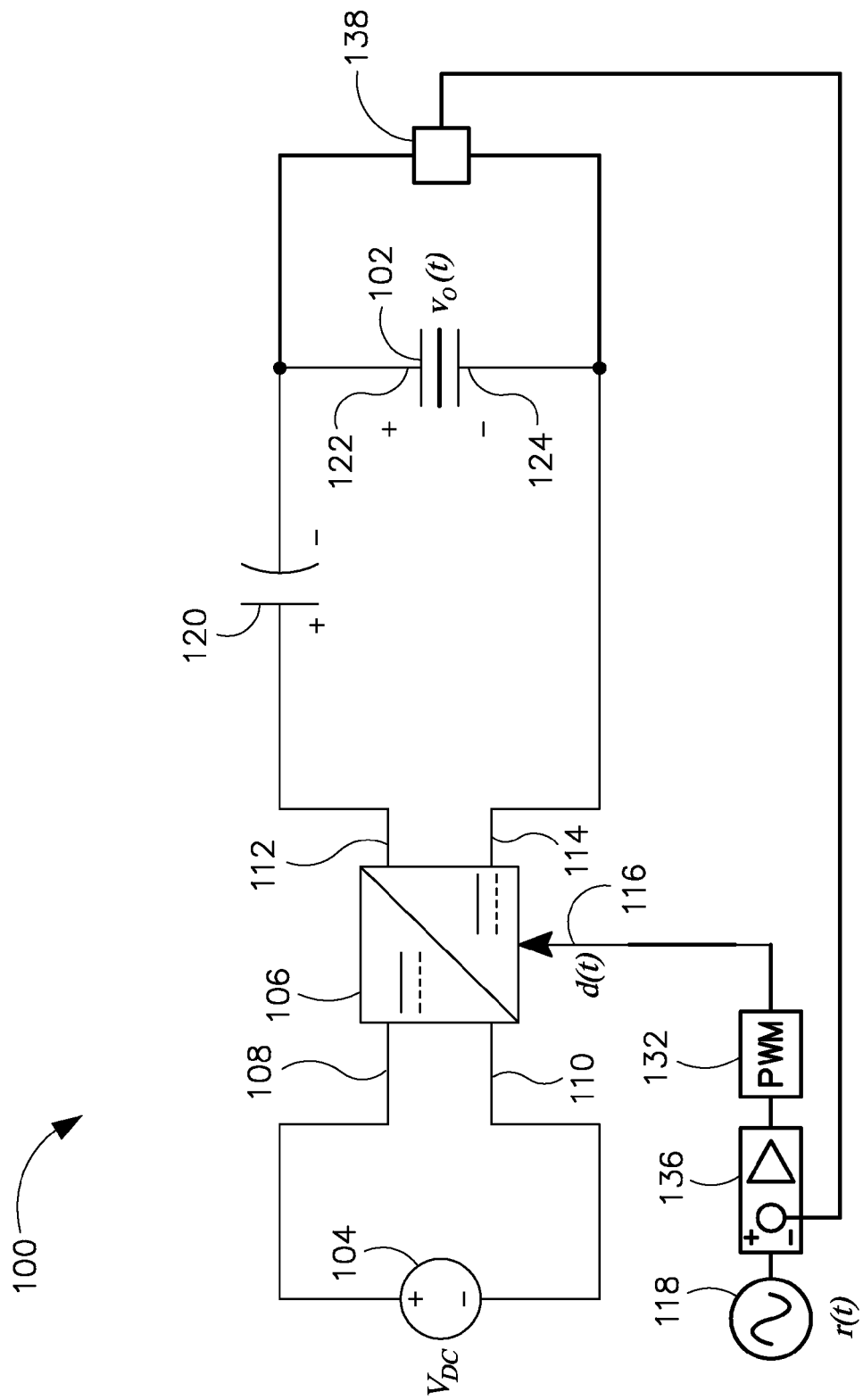
FIG. 3 is a block schematic diagram illustrating a piezoelectric driver according to another embodiment of the invention.

In cases where the control-to-output function of converter 106 is not linear or is not an acceptable approximation of linear, error correction or reduction methods may be used to correct the output of second converter 106 such that a more linear output is approximated. FIG. 3 illustrates a block schematic diagram showing an example of using feedback as a method of error correction according to an embodiment of the invention. FIG. 3 illustrates components of the piezoelectric driver 100 of FIG. 1 together with PWM 132 of FIG. 2. A compensator 136 is also shown coupled between AC voltage source 118 and PWM 132. Compensator 136 receives the output voltage $v_O(t)$ as measured across piezoelectric load 102 via a voltage sensor 138. The actual output waveform voltage $v_O(t)$ received from voltage sensor 138 is used to modify the input waveform voltage r(t) such that PWM control of converter 106 based on the modified input waveform voltage produces a desired output voltage waveform. In this manner, the input waveform voltage r(t) is modified using feedback to control converter 106 to approximate a linear conversion throughout a broad conversion range.

Figure 4:
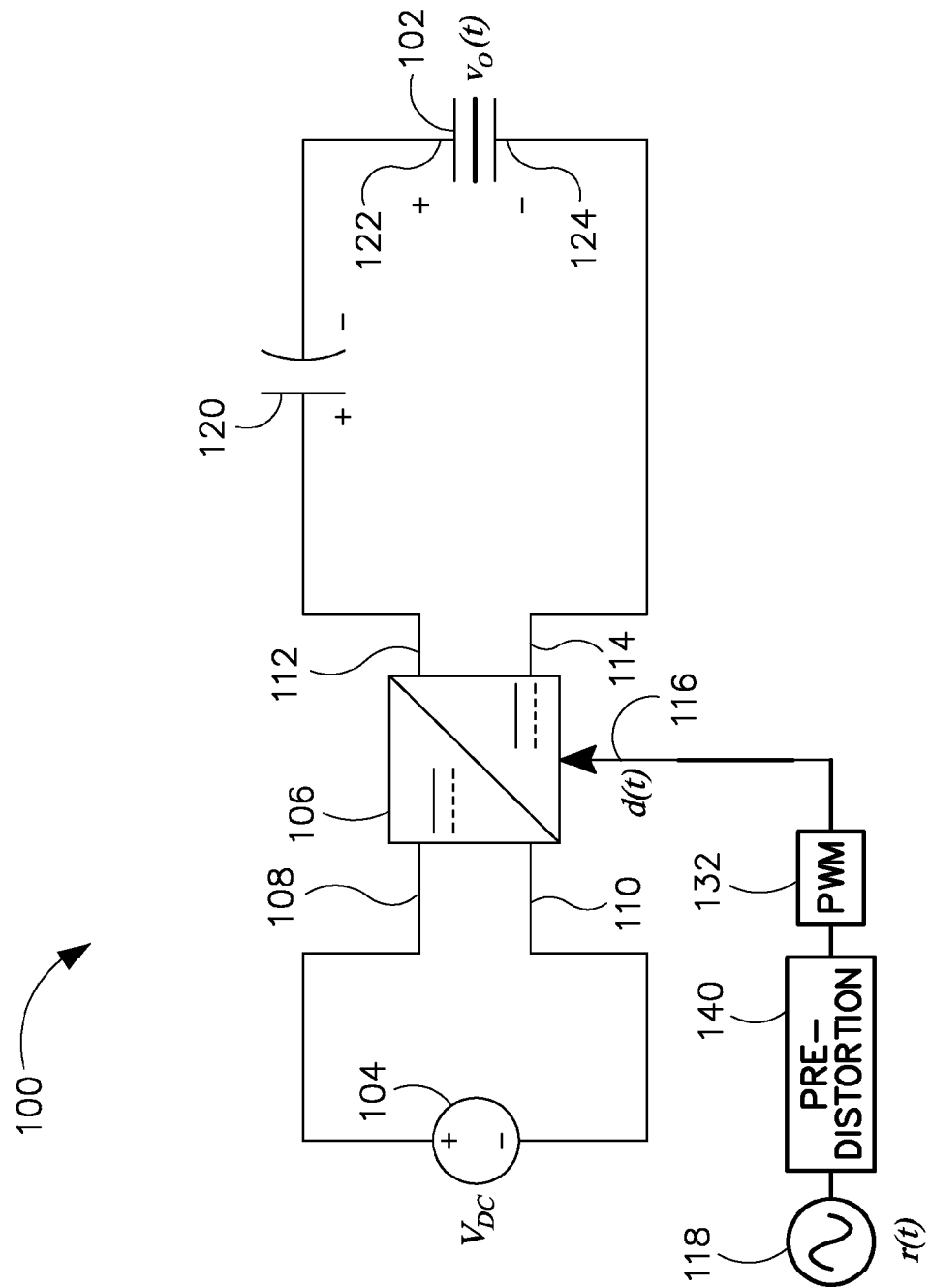
FIG. 4 is a block schematic diagram illustrating a piezoelectric driver according to another embodiment of the invention.

FIG. 4 illustrates a block schematic diagram showing an example of using pre-distortion as a method of error correction according to another embodiment of the invention. FIG. 4 illustrates components of the piezoelectric driver 100 of FIG. 1 together with PWM 132 of FIG. 2. A pre-distortion block 140 is also shown coupled between AC voltage source 118 and PWM 132. Pre-distortion 140 may be performed using a controller or other hardware components configured to modify the input waveform voltage r(t) such that PWM control of converter 106 based on the modified input waveform voltage produces a desired output voltage waveform vo(t). For example, the pre-distortion controller may be programmed with a look-up table or with a pre-distortion algorithm configured to distort the input waveform voltage r(t) based on a known boost conversion function behavior of converter 106 when controlled by the input waveform voltage r(t) throughout its waveform range. In this manner, the input waveform voltage r(t) is modified using pre-determined distortion modifications to control converter 106 to approximate a linear conversion throughout a broad conversion range.

FIG. 5 illustrates a controller 156 used to generate a specified command signal that can drive PWM 132. Controller 156 includes a function generation block 158 and a Σ-Δ (Sigma Delta) modulator block 160. In the function generation block 158, the desired waveform can be programmed as a function or as a look-up table. For example, a function generator may execute an algorithm to determine the digital values to use. Alternatively, the look-up table may have the digital values pre-calculated and stored therein. A digital controller or DSP (not shown) can take these digital values and further generate reference signal r(t) according to a variety of ways. In one embodiment, the digital values can be fed to a Digital to Analog Converter (DAC) 162 that generates an analog waveform. In another embodiment, the digital values can drive a pulse width modulator (not shown) internal to the digital controller 156 whose output is subsequently filtered through filters (not shown) to remove unwanted frequency components. In yet another embodiment, the digital values can drive digital PWM 132 that directly generates the power switch control waveforms.

Due to "quantization" when using digital waveform generation methods, the number of bits available in low cost microcontrollers is typically limited and usually means that there are "steps" or quanta visible in the reference waveform construction. These artifacts can be manifested as distortion or low fidelity waveforms at the output 164 of the controller 156. In some cases, these artifacts can result in undesirable behavior such as, for example, the generation of audible noise. Since the fundamental analog waveform can be of low frequency, removing these artifacts usually involves filtering higher order harmonics using bulky filters at the output 164. A filter block 166 is included as an interface between the controller 156 and the PWM 132. If nothing is done to address the quantization effects described above, heavy low pass filtering may be used to ensure that the quantization effects do not affect the output of the driver and converters. If the controller 156 has lower resolution, the cutoff frequency of the filters would be low enough that the reference signal r(t) may be attenuated. Compensating for this effect could entail a boost in power consumption.

When pre-distortion is employed, a low pass filter with a cutoff frequency close to the fundamental can cause inaccurate scaled representation of r(t) in first and second converters 106, 108. For example, since the output signal desired from the converters 106, 108 is a scaled representation of r(t), if converters 106, 108 are nonlinear, r(t) may be pre-distorted before being input to the PWM 132 as a signal r'(t) in a manner that compensates for the nonlinear behavior of the converters 106, 108. The pre-distorted signal r'(t) would modify the harmonics of r(t). If low pass filtering attenuates these harmonics or changes their phase relative to each other and to the fundamental, an undesired distortion will be added, and the output of converters 106, 108 will no longer be an accurate scaled representation of reference signal r(t).

To avoid the filtering constraints and to mitigate the quantization related effects, an increase in effective sampling resolution is used. Sigma Delta techniques can be implemented in the controller 156 to increase the resolution and reduce the impact of quantization. If the controller 156 has a sufficiently high sampling rate, the higher sampling and computation rates of the controller 156 can be traded off against the frequency components of the reference signal r(t) to oversample the signal. This can also be implemented as a look-up table, where the reference signal r(t) is oversampled and the entries are programmed as the look-up table in the controller 156.

An advantage of such oversampling is that any resulting inaccuracies or distortion in the sampled waveform is now dependent on the frequency at which the signal is over-sampled or overrepresented. The artifacts that previously arose from quantization are now shifted to higher frequencies. This allows the filtering to be implemented on the analog waveform as it comes out of the controller 156 with a higher cutoff frequency than possible with a conventional DAC since the sigma delta technique 160 shifts the artifact frequencies to a value much higher than the fundamental reference component. This has at least two benefits. First, the size and cost of the filter can be reduced. Second, the higher filter cutoff frequency made possible means that the filter's effect on harmonic components generated or modified by pre-distortion will be minimized, making the use of pre-distortion practical.

This method of generating a clean command to the PWM 132 is important to maintaining the fidelity of the output waveform $v_0(t)$. Indeed, in some implementations, the entire chain can be implemented in a microcontroller block or digital processor, including the filter 166 and PWM 132 as well.

Embodiments of the invention allow for a piezoelectric driver that has high efficiency, low cost, small size, and good waveform fidelity. In addition, using fly-back converters such as those described with respect to FIG. 2 in some embodiments allows galvanic isolation, a wide voltage range, and a common reference ground for all power switches. Further, compensating for non-linear DC-TO-DC conversion using feedback, pre-distortion, or other error correction techniques such as a feed-forward error correction technique allow the voltage across the piezoelectric actuator to be a linear approximation of the control signals used to control the boost conversion process.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

Therefore, according to an embodiment of the invention, a driver system includes a direct current (DC) voltage source and a bi-directional DC-to-DC converter having a primary side coupled to the DC voltage source and a secondary side and comprising a control input configured to receive a first control signal configured to control conversion of a first voltage on the primary side of the bi-directional DC-to-DC converter to a second voltage on the secondary side of the bi-directional DC-to-DC converter. The driver system also includes a capacitor coupled to the secondary side of the bi-directional DC-to-DC converter and configured to remove a DC offset of the second voltage and includes a reactive load having a first terminal coupled to the capacitor and a second terminal coupled to the secondary side of the bi-directional DC-to-DC converter.

According to another embodiment of the invention, a method of manufacturing a piezoelectric driver includes coupling a direct current (DC) voltage source to a low-voltage side of a voltage converter, wherein the voltage converter comprises a bi-directional DC-to-DC voltage converter, coupling a first high-voltage side terminal on a high-voltage side of the voltage converter to a blocking capacitor, and coupling the blocking capacitor to a first side of a piezoelectric actuator. The method also includes coupling a second side of the piezoelectric actuator to a second high-voltage side terminal of the voltage converter, coupling a control system to the voltage converter, and configuring the control system to supply a first control signal to the voltage converter. The first control signal controls the voltage converter to convert a voltage on the low-voltage side of the voltage converter to the high-voltage side of the voltage converter.

According to yet another embodiment of the invention, a piezoelectric driver includes a first bi-directional DC-to-DC voltage converter having a low-voltage side and a high-voltage side, a direct current (DC) voltage source coupled to the pair of low-side terminals, and a DC blocking capacitor coupled to the first high-voltage side terminal and comprising. The first bi-directional DC-to-DC voltage converter includes a pair of low-side terminals, a first high-voltage side terminal, and a second high-voltage side terminal. The piezoelectric driver also includes a piezoelectric actuator coupled to the DC blocking capacitor and coupled to the second high-voltage side terminal and includes a control system coupled to the first voltage converter and configured to supply a first control signal to the first bi-directional DC-to-DC voltage converter, wherein the first control signal is configured to control the first bi-directional DC-to-DC voltage converter to convert a voltage on the low-voltage side of the first bi-directional DC-to-DC voltage converter to the high-voltage side of the first bi-directional DC-to-DC voltage converter.

What is claimed as new and desired to be protected by Letters Patent of the United States is:

What is claimed is:
1. A driver system comprising:
   a direct current (DC) voltage source;
   a bi-directional DC-to-DC converter having a primary side coupled to the DC voltage source and a secondary side and comprising a control input configured to receive a first control signal configured to control conversion of a first voltage on the primary side of the bi-directional DC-to-DC converter to a second voltage on the secondary side of the bi-directional DC-to-DC converter;
   a capacitor coupled to the secondary side of the bi-directional DC-to-DC converter and configured to remove a DC offset of the second voltage; and
   a reactive load having a first terminal coupled to the capacitor and a second terminal coupled to the secondary side of the bi-directional DC-to-DC converter;
   a control system coupled to the bi-directional DC-to-DC converter and configured to:
      generate the first control signal based on a reference signal; and
      supply the first control signal to the bi-directional DC-to-DC converter; and
   an alternating current (AC) source configured to:
      generate the reference signal; and
      supply the reference signal to the control system.
2. The driver system of claim 1 wherein the reactive load comprises a piezoelectric load.
3. The driver system of claim 1 wherein the first bi-directional DC-to-DC converter comprises:
   a pair of primary-side terminals coupled to the DC voltage source;
   a first secondary-side terminal coupled to the capacitor; and
   a second secondary-side terminal coupled to the second terminal of the reactive load.
4. The driver system of claim 3 wherein the bi-directional DC-to-DC converter comprises:
   a transformer comprising:
      a primary-side winding; and
      a secondary-side winding;
   a first switch coupled to the primary-side winding; and
   a second switch coupled to the secondary-side winding.
5. The driver system of claim 4 wherein the first and second switches comprise power switches.
6. The driver system of claim 1 wherein the control system comprises pulse-width modulator.
7. The driver system of claim 1 wherein the control system further comprises a feedback circuit configured to measure a feedback voltage based on a voltage across the reactive load; and
   wherein the control system is further configured to modify the first control signal based on the feedback voltage such that the voltage across the reactive load substantially matches a target voltage.
8. The driver system of claim 1 wherein the control system further comprises a digital controller configured to generate the reference signal from a plurality of digital values determined via one of a function generator and a look-up table.
9. The driver system of claim 8 wherein the digital controller is further configured to convert the plurality of digital values to an analog signal via one of a digital to analog converter and a pulse-width modulator.

10. The driver system of claim 9 wherein the control system further comprises a filter configured to attenuate noise in the analog signal, wherein the noise is due to one of quantization and sampling.
11. The driver system of claim 9 wherein the digital controller, in being configured to convert the plurality of digital values to an analog signal, is configured to convert the plurality of digital values to an analog signal via a Sigma Delta modulator.
12. The driver system of claim 9 wherein the control system further comprises a filter configured to attenuate noise in the analog signal, wherein the noise is due to one of quantization and sampling; and
   wherein the digital controller, in being configured to convert the plurality of digital values to an analog signal, is configured to convert the plurality of digital values to an analog signal via a Sigma Delta modulator.
13. A method of manufacturing a piezoelectric driver comprising:
   coupling a direct current (DC) voltage source to a low-voltage side of a voltage converter, wherein the voltage converter comprises a bi-directional DC-to-DC voltage converter;
   coupling a first high-voltage side terminal on a high-voltage side of the voltage converter to a blocking capacitor;
   coupling the blocking capacitor to a first side of a piezoelectric actuator;
   coupling a second side of the piezoelectric actuator to a second high-voltage side terminal of the voltage converter;
   coupling a control system to the voltage converter;
   coupling an alternating current (AC) voltage source to the control system;
   configuring the AC voltage source to generate a reference signal and supply the reference signal to the control system;
   configuring the control system to generate a first control signal based on the reference signal and supply the first control signal to the voltage converter; and
   wherein the first control signal controls the voltage converter to convert a voltage on the low-voltage side of the voltage converter to the high-voltage side of the voltage converter.
14. The method of claim 13 wherein coupling the DC voltage source to the low-voltage side of the voltage converter comprises coupling the DC voltage source to a fly-back voltage converter.
15. The method of claim 14 further comprising forming the fly-back converter by:
   coupling a first power switch to a first winding of a transformer; and
   coupling a second power switch to a second winding of the transformer.
16. The method of claim 15 wherein the control system comprises a pulse-width modulator; and
   wherein coupling the control system to the voltage converter comprises:
      coupling an output of the pulse-width modulator to a control input of the first power switch;
      coupling the output of the pulse-width modulator to a signal complement generator configured to generate a second control signal, wherein the second control signal is a complement of the first control signal; and
      coupling the signal complement generator to a control input of the second power switch.

17. The method of claim 15 wherein coupling the first and second power switches comprise coupling first and second MOSFETs to respective first and second windings of the transformer.

18. The method of claim 13 wherein coupling the control system further comprises coupling a feedback control to the high-voltage side of the voltage converter; and further comprising configuring the control system to generate the first control signal based on a feedback signal from the feedback control.

19. A piezoelectric driver comprising:

a first bi-directional DC-to-DC voltage converter having a low-voltage side and a high-voltage side and comprising:

a pair of low-side terminals;

a first high-voltage side terminal; and a second high-voltage side terminal;

a direct current (DC) voltage source coupled to the pair of low-side terminals;

a DC blocking capacitor coupled to the first high-voltage side terminal;

a piezoelectric actuator coupled to the DC blocking capacitor and coupled to the second high-voltage side terminal;

a control system coupled to the first bi-directional DC-to-DC voltage converter and configured to supply a first control signal to the first bi-directional DC-to-DC voltage converter, wherein the first control signal is configured to control the first bi-directional DC-to-DC voltage converter to convert a voltage on the low-voltage side of the first bi-directional DC-to-DC voltage converter to the high-voltage side of the first bi-directional DC-to-DC voltage converter; and a pre-distortion controller configured to modify the first control signal such that the conversion of the voltage on the low-voltage side of the first bi-directional DC-to-DC voltage converter to the high-voltage side of the first bi-directional DC-to-DC voltage converter approximates a linear boost conversion of the first control signal.

20. The piezoelectric driver of claim 19 wherein the first bi-directional DC-to-DC converter comprises:

a transformer comprising:

a primary-side winding on the low-voltage side; and a secondary-side winding on the high-voltage side;

a first switch coupled to the primary-side winding; and a second switch coupled to the secondary-side winding.

21. The piezoelectric driver of claim 19 further comprising:

a feedback circuit configured to measure an output voltage based on a voltage across the piezoelectric actuator; and wherein the control system is further configured to modify the first control signal based on the feedback voltage such that a waveform of the output voltage substantially matches a desired waveform.

22. A driver system comprising:

a direct current (DC) voltage source;

a bi-directional DC-to-DC converter having a primary side coupled to the DC voltage source and a secondary side and comprising a control input configured to receive a first control signal configured to control conversion of a first voltage on the primary side of the bi-directional DC-to-DC converter to a second voltage on the secondary side of the bi-directional DC-to-DC converter;

a capacitor coupled to the secondary side of the bi-directional DC-to-DC converter and configured to remove a DC offset of the second voltage; and a reactive load having a first terminal coupled to the capacitor and a second terminal coupled to the secondary side of the bi-directional DC-to-DC converter; and a control system coupled to the bi-directional DC-to-DC converter and configured to:

generate the first control signal based on a reference signal; and supply the first control signal to the bi-directional DC-to-DC converter;

wherein the control system further comprises a pre-distortion controller configured to modify the first control signal such that a voltage across the reactive load approximates a linear boost conversion of the first control signal.

23. The driver system of claim 22 wherein a control-to-output function of the bi-directional DC-to-DC converter is non-linear.

* * * * *